United States Patent
Kim et al.

(10) Patent No.: US 8,895,985 B2
(45) Date of Patent: Nov. 25, 2014

(54) ARRAY SUBSTRATE FOR LIQUID CRYSTAL DISPLAY AND METHOD FOR MANUFACTURING THE SAME

(71) Applicant: LG Display Co., Ltd., Seoul (KR)

(72) Inventors: Kangil Kim, Paju-si (KR); Sungyong Jang, Paju-si (KR); Cheolhwan Lee, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 10 days.

(21) Appl. No.: 13/888,907

(22) Filed: May 7, 2013

(65) Prior Publication Data

US 2014/0145195 A1   May 29, 2014

(30) Foreign Application Priority Data

Nov. 23, 2012 (KR) .................. 10-2012-0134045

(51) Int. Cl.
*H01L 29/04* (2006.01)
*H01L 29/786* (2006.01)
*H01L 29/66* (2006.01)

(52) U.S. Cl.
CPC ........ *H01L 29/786* (2013.01); *H01L 29/66742* (2013.01)
USPC .......................................................... 257/59

(58) Field of Classification Search
USPC ........ 257/59, 72, E27.135, E27.141, E27.132
See application file for complete search history.

(56) References Cited

U.S. PATENT DOCUMENTS

| | | | |
|---|---|---|---|
| 7,528,409 B2 * | 5/2009 | Kim et al. ................ | 257/66 |
| 7,847,289 B2 * | 12/2010 | Kim et al. ................ | 257/59 |
| 8,168,980 B2 * | 5/2012 | Tsubata et al. ........... | 257/72 |
| 2013/0277668 A1 * | 10/2013 | Yoo et al. ................ | 257/43 |
| 2014/0159034 A1 * | 6/2014 | Yang ...................... | 257/43 |
| 2014/0167028 A1 * | 6/2014 | Sekiguchi et al. ........ | 257/40 |

* cited by examiner

*Primary Examiner* — Thao P Le
(74) *Attorney, Agent, or Firm* — Brinks Gilson & Lione

(57) ABSTRACT

An array substrate for a liquid crystal display includes a substrate and first and second subpixels which are positioned on the substrate and are defined by a crossing structure of one gate line, a first data line, a second data line, a first common line, and a second common line. The first subpixel includes a first semiconductor layer, a first source electrode, a first drain electrode, and a first pixel electrode connected to the first drain electrode. The second subpixel includes a second semiconductor layer, a second source electrode, a second drain electrode, and a second pixel electrode connected to the second drain electrode. The first and second subpixels share the one gate line with each other, and the first drain electrode and the second drain electrode are exposed through one contact hole.

13 Claims, 5 Drawing Sheets

ARRAY SUBSTRATE FOR LIQUID CRYSTAL DISPLAY AND METHOD FOR MANUFACTURING THE SAME

CROSS-REFERENCE TO RELATED APPLICATIONS

This application claims the priority benefit of Korean Patent Application No. 10-2012-0134045 filed on Nov. 23, 2012, which is incorporated herein by reference for all purposes as if fully set forth herein.

BACKGROUND OF THE INVENTION

1. Field of the Invention

Embodiments of the invention relate to a liquid crystal display and a method for manufacturing the same, and more particularly, to an array substrate for a liquid crystal display, which has improved transmittance and a method for manufacturing the same.

2. Discussion of the Related Art

A liquid crystal display is generally driven using optical anisotropy and polarization properties of liquid crystals. Because the liquid crystals have an elongated shape, liquid crystal molecules have an orientation in the alignment. The orientation of the alignment of the liquid crystal molecules may be controlled by applying an electric field to the liquid crystals. Thus, when the orientation of the alignment of the liquid crystal molecules is adjusted, the alignment of the liquid crystal molecules may be changed. Light is refracted in the orientation of the alignment of the liquid crystal molecules by the optical anisotropy, thereby displaying image information.

An active matrix liquid crystal display (AMLCD) (hereinafter abbreviated to "liquid crystal display"), in which thin film transistors and pixel electrodes connected to the thin film transistors are arranged in a matrix form, has been now attracted much attention because of its excellent resolution and motion picture display performance. The liquid crystal display includes a color filter substrate on which common electrodes are formed, an array substrate on which the pixel electrodes are formed, and liquid crystals interposed between the color filter substrate and the array substrate. In the liquid crystal display, the common electrodes and the pixel electrodes drive the liquid crystals by a vertically applied electric field, thus providing an excellent transmittance, an excellent aperture ratio, and the like.

However, the drive of liquid crystals by the vertically applied electric field is disadvantageous in that a viewing angle is not good. Thus, an in-plane switching (IPS) liquid crystal display having the excellent viewing angle was proposed. In the in-plane switching liquid crystal display, a thin film transistor is formed on a substrate. The thin film transistor is insulated by an organic insulating layer, and then a passivation film is formed between a common electrode and a pixel electrode. Vertical and horizontal electric fields are applied between the common electrode and the pixel electrode.

FIG. 1 is a plan view of a related art array substrate for a liquid crystal display.

As shown in FIG. 1, a gate line 12 arranged in one direction and a data line 15 crossing the gate line 12 define a subpixel P. A common line 16 is positioned parallel to the gate line 12. The subpixel P includes a switching thin film transistor Tr including a gate electrode 17, a gate insulating layer (not shown), a semiconductor layer (not shown), a source electrode 19, and a drain electrode 21.

The subpixel P further includes a pixel electrode 23 of a plate shape electrically connected to the drain electrode 21 of the switching thin film transistor Tr and a common electrode 25 positioned opposite the pixel electrode 23. The common electrode 25 includes a plurality of openings 27 which are spaced apart from one another by a predetermined distance in the subpixel P and each have a bar shape.

The related art array substrate has a contact hole CH, in which the drain electrode 21 and the pixel electrode 23 are connected to each other, so as to apply a voltage from the switching thin film transistor Tr to the pixel electrode 23. However, a depth of the contact hole CH between the drain electrode 21 and the pixel electrode 23 may increase due to the presence of an organic insulating layer formed between the drain electrode 21 and the pixel electrode 23. Hence, an alignment layer formed on the entire surface of the substrate is not spread over the area where the contact hole CH is formed. Further, because the contact hole CH is formed in each subpixel P, an aperture ratio of the liquid crystal display is reduced.

SUMMARY OF THE INVENTION

Embodiments of the invention provide an array substrate for a liquid crystal display, which can improve a transmittance by reducing a number of contact holes and allow an alignment layer to be spread over contact holes without compromising an aperture ratio, and a method for manufacturing the same.

In one aspect, there is an array substrate for a liquid crystal display including a substrate and first and second subpixels which are positioned on the substrate and are defined by a crossing structure of one gate line, a first data line, a second data line, a first common line, and a second common line. The first subpixel includes a first semiconductor layer, a first source electrode, a first drain electrode, and a first pixel electrode connected to the first drain electrode, and the second subpixel includes a second semiconductor layer, a second source electrode, a second drain electrode, and a second pixel electrode connected to the second drain electrode. The first subpixel and the second subpixel share the one gate line with each other, and the first drain electrode of the first subpixel and the second drain electrode of the second subpixel are exposed through one contact hole.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
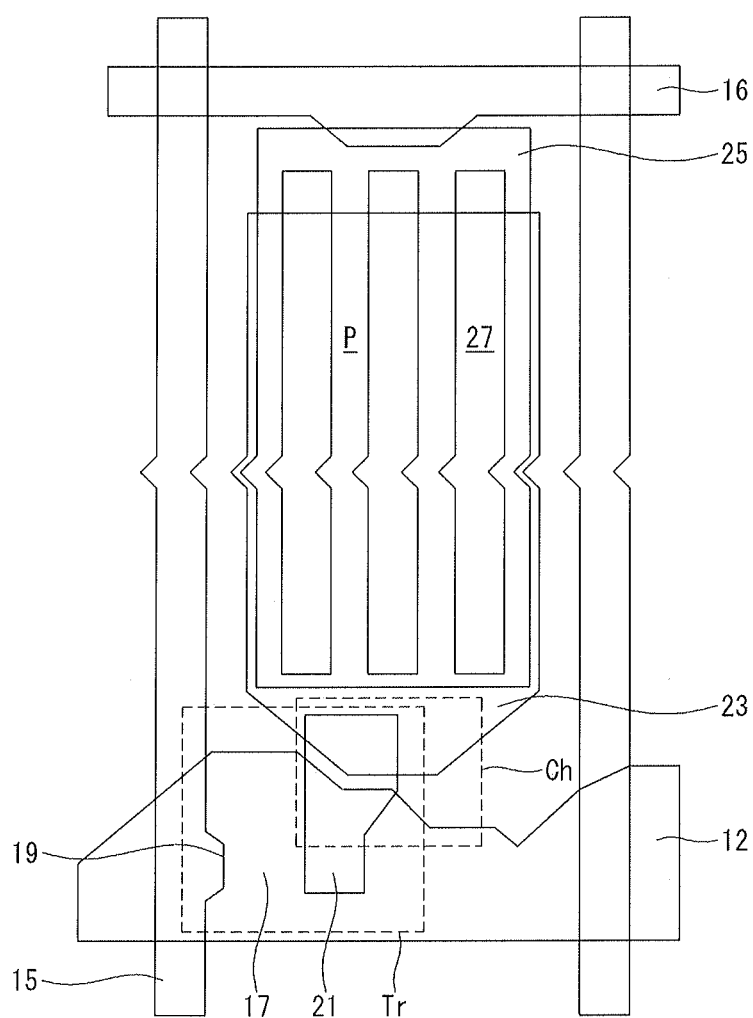
FIG. 1 is a plan view of a related art array substrate for a liquid crystal display.
Figure 2:
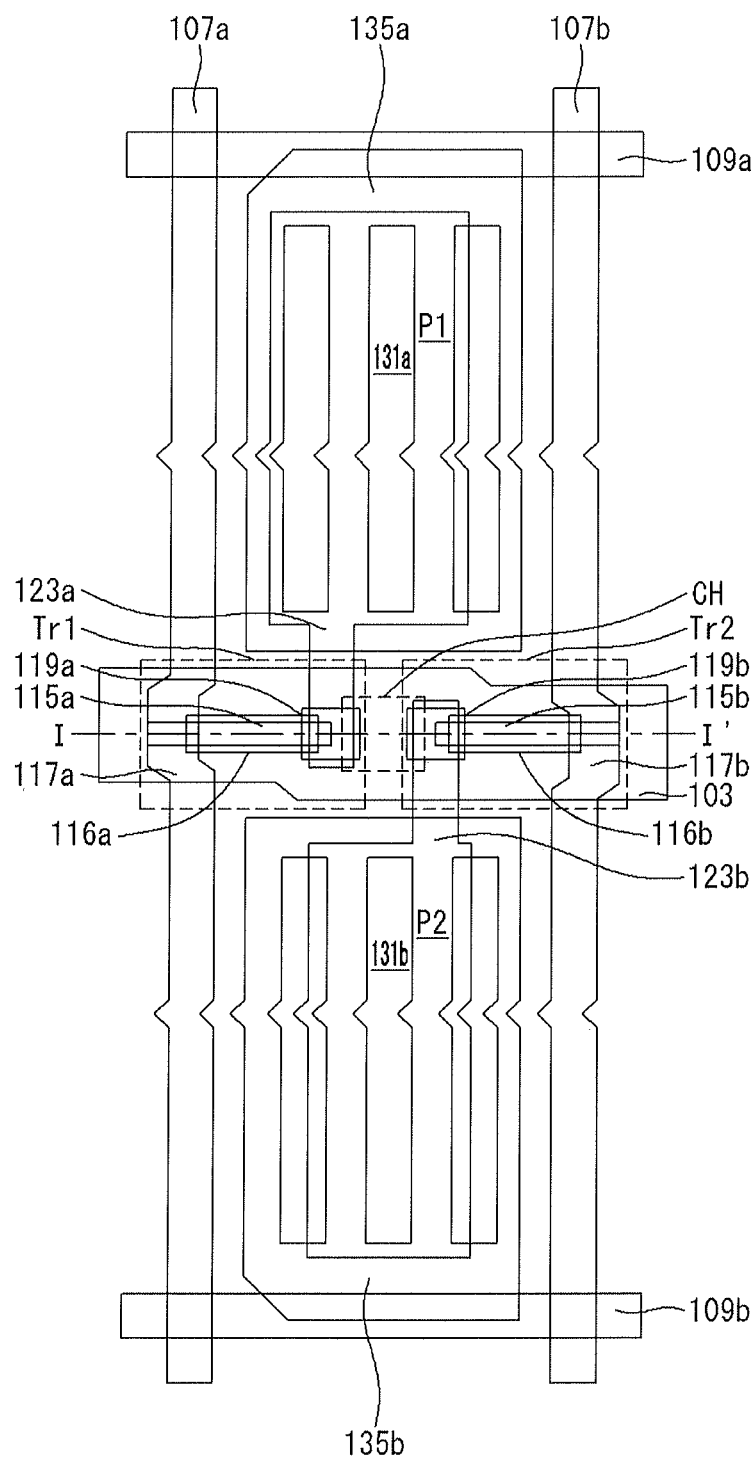
FIG. 2 is a plan view of an array substrate for a liquid crystal display according to an exemplary embodiment of the invention.
Figure 3:
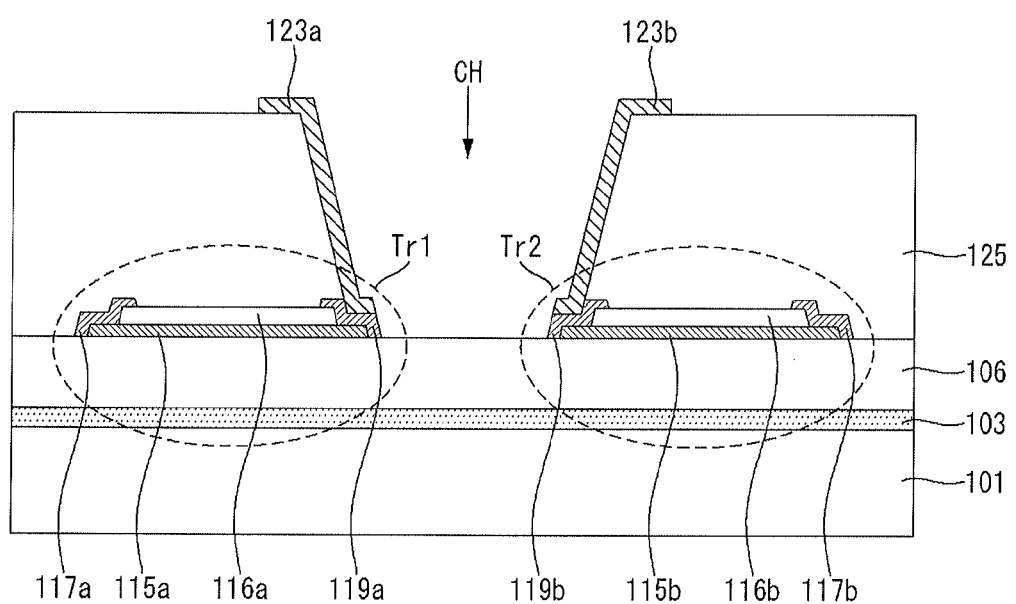
FIG. 3 is a cross-sectional view taken along line I-I' of FIG. 2.

FIG. 2 is a plan view of an array substrate for a liquid crystal display according to an example embodiment of the invention. FIG. 3 is a cross-sectional view taken along line I-I' of FIG. 2.

As shown in FIG. 2, gate lines 103 are positioned on a substrate (not shown) including a plurality of subpixels P and extend in one direction, and data lines 107a and 107b crossing the gate lines 103 are positioned on the substrate. Common lines 109a and 109b are positioned parallel to the gate lines 103 and thus cross the data lines 107a and 107b. The plurality of subpixels P are defined by a crossing structure of the gate lines 103, the data lines 107a and 107b, and the common lines 109a and 109b. In the embodiment of the invention, the two data lines 107a and 107b, the one gate line 103 and the two common lines 109a and 109b crossing the two data lines 107a and 107b define the two subpixels P. In the following description, for example, the data line and the common line to apply a signal to a first subpixel P1 are defined as a first data line 107a and a first common line 109a, and the data line and the common line to apply a signal to a second subpixel P2 are defined as a second data line 107b and a second common line 109b. Further, each of the first subpixel P1 and the second subpixel P2 includes a semiconductor layer, a source electrode, a drain electrode, and a pixel electrode.

More specifically, the first subpixel P1 includes a first thin film transistor Tr1 including a gate electrode (not shown) connected to the gate line 103, a gate insulating layer (not shown), a semiconductor layer 115a, a source electrode 117a electrically connected to the data line 107a, and a drain electrode 119a separated from the source electrode 117a. Further, the second subpixel P2 includes a second thin film transistor Tr2 including a gate electrode (not shown) connected to the gate line 103, a gate insulating layer (not shown), a semiconductor layer 115b, a source electrode 117b electrically connected to the data line 107b, and a drain electrode 119b separated from the source electrode 117b.

FIG. 2 shows that each of the first and second thin film transistors Tr1 and Tr2 has a T-shaped channel region. However, the embodiment of the invention is not limited thereto. For example, a U-shaped channel region may be used. In each of the first and second thin film transistors Tr1 and Tr2, the gate electrode is formed by the gate line 103. However, the embodiment of the invention is not limited thereto. For example, the gate electrodes may extend from the gate line 103 to the first and second subpixels P1 and P2.

In the first and second subpixels P1 and P2, first and second pixel electrodes 123a and 123b of a plate shape are respectively connected to the drain electrodes 119a and 119b of the first and second thin film transistors Tr1 and Tr2. First and second common electrodes 135a and 135b are positioned opposite to the first and second pixel electrodes 123a and 123b of the first and second subpixels P1 and P2, respectively. The first common electrode 135a has a plurality of openings of a bar shape, and the second common electrode 135b has a plurality of openings of a bar shape.

Accordingly, the first subpixel P1 is defined by the gate line 103, the first data line 107a, and the first common line 109a and includes the first semiconductor layer 115a, the first source electrode 117a, the first drain electrode 119a, the first pixel electrode 123a, and the first common electrode 135a. Further, the second subpixel P2 is defined by the gate line 103, the second data line 107b, and the second common line 109b and includes the second semiconductor layer 115b, the second source electrode 117b, the second drain electrode 119b, the second pixel electrode 123b, and the second common electrode 135b. In the embodiment of the invention, the first and second subpixels P1 and P2 share the gate line 103 with each other.

In the embodiment of the invention, the first pixel electrode 123a is connected to the drain electrode 119a through a contact hole CH, which exposes the drain electrode 119a of the first thin film transistor Tr1 and the drain electrode 119b of the second thin film transistor Tr2 at a time. Further, the second pixel electrode 123b is connected to the drain electrode 119b through the contact hole CH. This is described in detail in a method for manufacturing the array substrate for the liquid crystal display according to the embodiment of the invention.

A structure of the array substrate for the liquid crystal display is described in detail below.

As shown in FIG. 3, in the array substrate for the liquid crystal display according to the embodiment of the invention, a gate electrode 103, which forms an integral body along with the gate line (not shown) arranged in one direction, is positioned on a substrate 101, and a gate insulating layer 106 for insulating the gate electrode 103 is positioned on the gate electrode 103. The first semiconductor layer 115a and the second semiconductor layer 115b are positioned on the gate insulating layer 106 at a location corresponding to the gate electrode 103. A first etch stopper 116a is positioned on the first semiconductor layer 115a, and a second etch stopper 116b is positioned on the second semiconductor layer 115b. The first source electrode 117a and the first drain electrode 119a are positioned at both ends of the first semiconductor layer 115a. The second source electrode 117b and the second drain electrode 119b are positioned at both ends of the second semiconductor layer 115b.

Accordingly, the first thin film transistor Tr1 includes the gate electrode 103, the first semiconductor layer 115a, the first etch stopper 116a, the first source electrode 117a, and the first drain electrode 119a. The second thin film transistor Tr2 includes the gate electrode 103, the second semiconductor layer 115b, the second etch stopper 116b, the second source electrode 117b, and the second drain electrode 119b.

An organic insulating layer 125 protecting the first thin film transistor Tr1 and the second thin film transistor Tr2 is positioned on the first and second thin film transistors Tr1 and Tr2 and the substrate 101. A contact hole CH is formed through the organic insulating layer 125 to expose the first drain electrode 119a of the first thin film transistor Tr1 and the second drain electrode 119b of the second thin film transistor Tr2. The first pixel electrode 123a and the second pixel electrode 123b are positioned on the organic insulating layer 125. In this instance, the first pixel electrode 123a extends toward the contact hole CH and is connected to the first drain electrode 119a through the contact hole CH, and the second pixel electrode 123b extends toward the contact hole CH and is connected to the second drain electrode 119b through the contact hole CH.

As described above, in the array substrate for the liquid crystal display according to the embodiment of the invention, the two subpixels share one gate line, and the drain electrodes and the pixel electrodes of the two subpixels are connected to each other through one contact hole. Hence, the embodiment of the invention may reduce the number of contact holes by half, thereby increasing an aperture ratio of the liquid crystal display and allowing an alignment layer to spread over contact hole areas.

A method for manufacturing the array substrate for the liquid crystal display according to the embodiment of the invention shown in FIG. 3 is described below. FIGS. 4A to 4D sequentially illustrate each of stages in a method for manufacturing the array substrate for the liquid crystal display according to the embodiment of the invention.

Figure 4A:
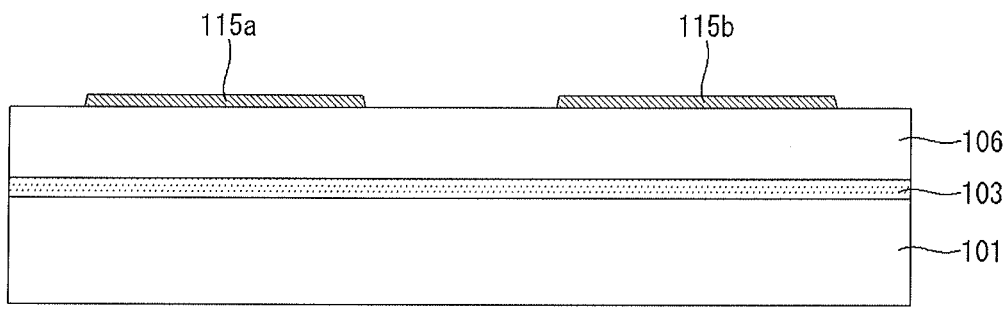
FIGS. 4A to 4D sequentially illustrate each of stages in a method for manufacturing an array substrate for a liquid crystal display according to an exemplary embodiment of the invention.

As shown in FIG. 4A, a metal material (for example, one metal material selected among aluminum (Al), aluminum neodymium (AlNd), copper (Cu), copper alloy, chrome (Cr), and molybdenum (Mo)) having low resistance characteristics is deposited on a substrate 101. Then, the deposited metal material is patterned using a photolithographic method to form a gate electrode 103.

Next, silicon oxide (SiOx) or silicon nitride (SiNx) is deposited on the substrate 101, on which the gate electrode 103 is formed, to form a gate insulating layer 106. Subsequently, one oxide selected among zinc oxide (ZnO), indium zinc oxide (IZO), zinc tin oxide (ZTO) and indium gallium zinc oxide (IGZO) is deposited on the substrate 101 and then is patterned to form a first semiconductor layer 115a and a second semiconductor layer 115b.

The embodiment of the invention describes an oxide semiconductor containing metal oxide as an example of the semiconductor layer, but is not limited thereto. For example, amorphous silicon (a-si), polycrystalline silicon (poly-Si), or an organic semiconductor formed of an organic material may be used in another embodiment. In embodiments of using amorphous silicon, polycrystalline silicon, or an organic semiconductor, an etch stopper may not be needed.

Figure 4B:
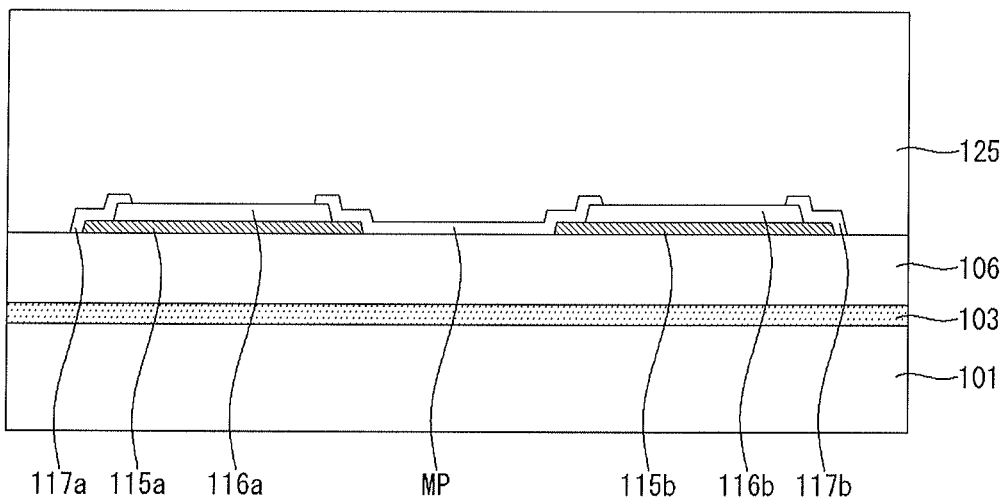

Next, as shown in FIG. 4B, silicon oxide (SiOx) or silicon nitride (SiNx) is deposited on a front surface of the substrate 101, on which the first semiconductor layer 115a and the second semiconductor layer 115b are formed, and is patterned to form a first etch stopper 116a on the first semiconductor layer 115a and to form a second etch stopper 116b on the second semiconductor layer 115b.

A metal material (for example, one metal material selected among aluminum (Al), aluminum neodymium (AlNd), copper (Cu), copper alloy, chrome (Cr), and molybdenum (Mo)) having low resistance characteristics is deposited on the substrate 101. Then, the deposited metal material is patterned to form a first source electrode 117a connected to one end of the first semiconductor layer 115a and to form a second source electrode 117b connected to one end of the second semiconductor layer 115b. In this instance, a metal pattern MP connecting the first semiconductor layer 115a and the second semiconductor layer 115b remains. Subsequently, photoacryl is applied on the substrate 101 to form an organic insulating layer 125.

Figure 4C:
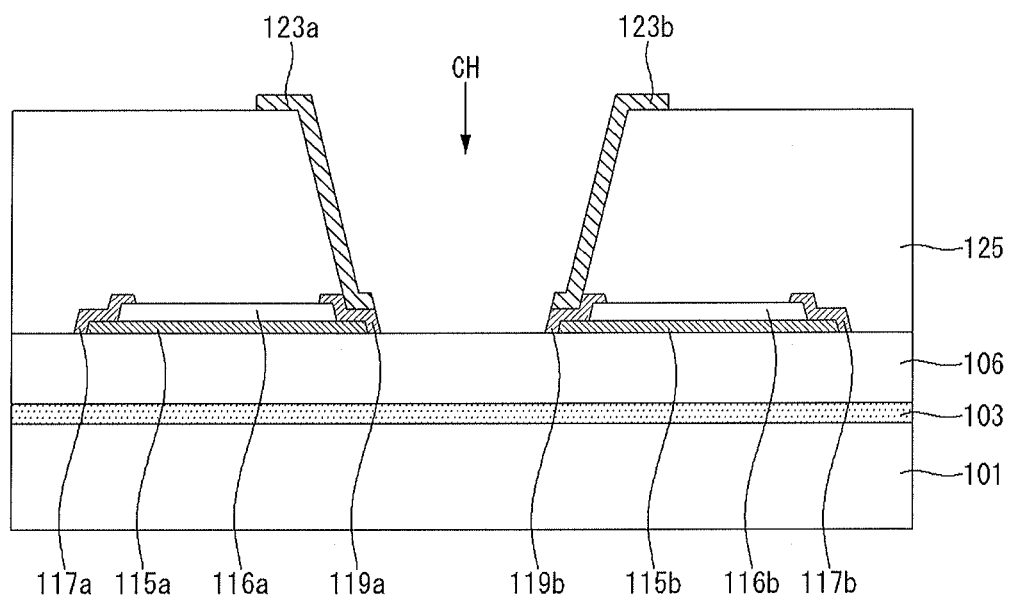

Next, as shown in FIG. 4C, the organic insulating layer 125 is exposed and developed to expose the metal pattern MP that connects the first semiconductor layer 115a to the second semiconductor layer 115b. Hence, a contact hole CH is formed. One transparent conductive material, which is selected among indium tin oxide (ITO), indium zinc oxide (IZO), indium tin zinc oxide (ITZO), and zinc oxide (ZnO), is deposited on the substrate 101 to form a transparent conductive layer TC.

Figure 4D:
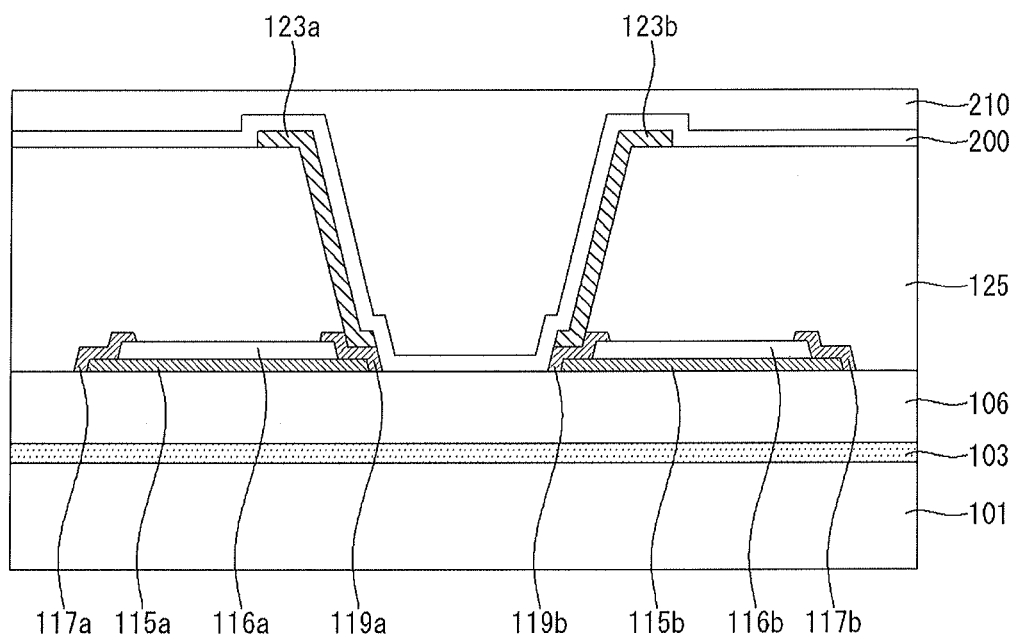

Next, as shown in FIG. 4D, the transparent conductive layer TC is patterned using a photolithographic method to form a first pixel electrode 123a and a second pixel electrode 123b. Substantially simultaneously, the metal pattern MP is etched to form a first drain electrode 119a and a second drain electrode 119b. More specifically, when the transparent conductive layer TC is patterned, the metal pattern MP is etched and divided. Hence, the first drain electrode 119a is connected to one end of the first semiconductor layer 115a, and the first pixel electrode 123a is connected to the first drain electrode 119a. Further, the second drain electrode 119b is connected to one end of the second semiconductor layer 115b, and the second pixel electrode 123b is connected to the second drain electrode 119b.

Next, silicon oxide (SiOx) or silicon nitride (SiNx) is deposited on the front surface of the substrate 101 to form a passivation layer 200. Although not shown, one transparent conductive material, selected among indium tin oxide (ITO), indium zinc oxide (IZO), indium tin zinc oxide (ITZO), and zinc oxide (ZnO), is deposited on the substrate 101 and is patterned to form common electrodes. Next, polyimide is applied on the front surface of the substrate 101 to form an alignment layer 210. Because the alignment layer 210 is formed using polyimide of a liquid state, the alignment layer 210 is applied on the substrate 101 and is widely spread on the substrate 101. Hence, the alignment layer 210 fills a hole, for example, the contact hole CH.

As described above, in the array substrate for the liquid crystal display according to the embodiment of the invention, the drain electrodes and the pixel electrodes of two subpixels are connected through one contact hole and two subpixels share one gate line, thereby reducing the number of contact holes by half. Hence, the aperture ratio of the liquid crystal display may be increased, and the alignment layer may be applied over the area where the contact holes are formed without compromising the aperture ratio.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An array substrate for a liquid crystal display comprising:
   a substrate; and
   first and second subpixels which are positioned on the substrate and are defined by a crossing structure of one gate line, a first data line, a second data line, a first common line, and a second common line,
   wherein the first subpixel includes a first semiconductor layer, a first source electrode, a first drain electrode, and a first pixel electrode connected to the first drain electrode, and the second subpixel includes a second semiconductor layer, a second source electrode, a second drain electrode, and a second pixel electrode connected to the second drain electrode,
   wherein the first subpixel and the second subpixel share the one gate line with each other, and the first drain electrode of the first subpixel and the second drain electrode of the second subpixel are exposed through one contact hole.

2. The array substrate for the liquid crystal display of claim 1, wherein the first subpixel includes a first thin film transistor including a gate electrode, the first semiconductor layer, the first source electrode, and the first drain electrode,
   wherein the second subpixel includes a second thin film transistor including the gate electrode, the second semiconductor layer, the second source electrode, and the second drain electrode.

3. The array substrate for the liquid crystal display of claim 2, wherein the first semiconductor layer, the first source electrode and the first drain electrode and the second semiconductor layer, the second source electrode and the second drain electrode are positioned above the one gate line.

4. The array substrate for the liquid crystal display of claim 1, wherein the gate line has two opposing sides and the first subpixel and the second subpixel are positioned adjacent to the each opposing side of the one gate line, respectively.

5. An array substrate for a liquid crystal display comprising:
   a substrate;
   a first thin film transistor arranged on the substrate and including a first drain electrode;
   a second thin film transistor arranged on the substrate and including a second drain electrode; and
   an organic insulating layer arranged on the first and second thin film transistors;
   a first pixel electrode arranged on the organic insulating layer and above the first thin film transistor;
   a second pixel electrode arranged on the organic insulating layer and above the second thin film transistor; and
   common contact hole for both the first thin film transistor and the second thin film transistor, wherein the first drain electrode is connected to the first pixel electrode through the common contact hole, and the second drain electrode is connected to the second pixel electrode through the common contact hole.

6. The array substrate according to claim 5, further comprising a common gate line, wherein the first thin film transistor and the second thin film transistor share the common gate line as a gate electrode.

7. The array substrate according to claim 6, wherein the first semiconductor layer, the first source electrode and the first drain electrode, and the second semiconductor layer, the second source electrode and the second drain electrode are disposed above and aligned along the common gate line.

8. The array substrate according to claim 6, further comprising a first subpixel and a second subpixel, the first subpixel being defined by a first data line, a first common line and the common gate line, and the second subpixel being defined by a second data line, a second common line, and the common gate line.

9. The array substrate according to claim 8, wherein the common gate line is disposed between the first common line and the second common line.

10. The array substrate according to claim 8, wherein the first and second subpixels are disposed opposing each other with the common gate line disposed therebetween.

11. The array substrate according to claim 5, wherein the first drain electrode and the second drain electrode are arranged spaced apart from each other with the common contact hole therebetween.

12. The array substrate according to claim 6, wherein the common contact hole is disposed above the common gate line.

13. The array substrate according to claim 5, wherein the first pixel electrode and the second pixel electrode extend via the contact hole to contact the first and second drain electrodes, respectively.

* * * * *